(12) United States Patent
Buchanan

(10) Patent No.: US 6,179,974 B1
(45) Date of Patent: Jan. 30, 2001

(54) APPARATUS AND METHODS FOR SPUTTERING

(75) Inventor: Keith Edward Buchanan, White Brook (GB)

(73) Assignee: Trikon Holdings Ltd., Newport Gwent (GB)

(*) Notice: Under 35 U.S.C. 154(b), the term of this patent shall be extended for 0 days.

(21) Appl. No.: 09/414,717

(22) Filed: Oct. 12, 1999

(30) Foreign Application Priority Data

Oct. 23, 1998 (GB) .................................................. 9823113

(51) Int. Cl.⁷ .................................................. C23C 14/34
(52) U.S. Cl. .................. 204/192.12; 204/298.06; 204/298.16; 204/298.08; 204/298.19; 204/298.11
(58) Field of Search ........................ 204/298.06, 298.16, 204/298.08, 298.19, 192.12, 298.11

(56) References Cited

U.S. PATENT DOCUMENTS

| | | | |
|---|---|---|---|
| 3,897,325 | 7/1975 | Aoshima et al. | 204/298.06 |
| 3,962,988 | 6/1976 | Murayama et al. | 118/723 VE |
| 4,013,533 * | 3/1977 | Cohen-Solal et al. | 204/298.11 |
| 4,046,660 * | 9/1977 | Fraser | 204/298.16 |
| 4,810,935 | 3/1989 | Boswell | 315/111.41 |
| 4,880,515 | 11/1989 | Yoshikawa et al. | 204/192.12 |
| 5,085,755 | 2/1992 | Setoyama et al. | 204/298.16 |
| 5,178,739 * | 1/1993 | Barnes et al. | 204/298.06 |
| 5,180,476 | 1/1993 | Ishibashi et al. | 204/192.29 |
| 5,431,799 * | 7/1995 | Mosely et al. | 204/298.06 |

FOREIGN PATENT DOCUMENTS

| | | | |
|---|---|---|---|
| 0 710 056 A1 | 5/1996 | (EP) | H05H/1/46 |
| 0 818 556 A1 | 1/1998 | (EP) | C23C/14/34 |
| 8-302464 | 11/1996 | (JP) | C23C/14/34 |
| 9-256149 | 9/1997 | (JP) | C23C/14/35 |
| 10-183344 | 7/1998 | (JP) | C23C/14/35 |
| 10-204634 | 8/1998 | (JP) | C23C/14/35 |

* cited by examiner

*Primary Examiner*—Nam Nguyen
*Assistant Examiner*—Daborah Chacko-Davis
(74) *Attorney, Agent, or Firm*—Jones Volentine, LLC

(57) ABSTRACT

This invention relates to sputtering materials onto workpieces. Sputter Apparatus which is generally indicated at 10, is provided with additional D.C. coils 23, 23, to increase uniformity of deposition.

19 Claims, 16 Drawing Sheets

APPARATUS AND METHODS FOR SPUTTERING

BACKGROUND OF THE INVENTION

This invention relates to methods and apparatus for sputtering and in particular, but not exclusively, to sputtering material onto workpieces having high aspect ratio formations.

As is well known in the art, the sputtering process normally consists of causing energetic ions from a plasma to strike a target of the desired material, or a component part thereof, so that atoms from the target are ejected. In sputter deposition these ejected atoms are intended to be deposited on the surface of a workpiece. The initial direction of travel of the atoms is close to being cosine, however several apparently conflicting factors can determine how many atoms reach the workpiece and with what level of uniformity across the surface of the workpiece at what angular distribution and to what extent they penetrate into high aspect formations, occurs.

Thus, for example, given a uniform erosion of a large target (as is typically the case) a low chamber pressure will usually produce good uniformity, across a substantially planar surface. This is because of the relatively low working gas density reducing the number of scattering collisions. For those atoms which are ejected substantially normally to the target, there is a low probability of collision and hence a higher probability that they will reach the workpiece with the same angular distribution. Conversely, high pressures produce a higher number of collisions causing more of the sputtered atoms to be lost to the chamber walls. This tends to lead to a deposited layer that is thicker towards the centre than the outside of the workpiece. However at higher pressures, with the relatively high probability of collisions of sputtered material, there is a higher probability of sputtered material being ionized due to these collisions. Ionised sputtered material may then be attracted normally to the substrate surface by the application of a negative charge e.g. through the use of a bias R.F. or D.C. power supply or self biassing controlled by a variable impedance to ground potential. The need to have a good percentage of the ejected atoms ionised is particularly great, when there are high aspect ratio formations in the workpiece, because it is only those atoms which are travelling at or near perpendicularly to the opening of the mouth of the formation. As the aspect ratio increases e.g. as a recess diameter decreases and/or depth increases the direction of the arriving material needs to be more nearly perpendicular. This is to avoid the recess being closed off at its mouth by sputtered material arriving at non-normal angles and to ensure an adequate coverage of the base of recesses. Hence, an ionised high pressure sputter process will achieve improved base coverage in high aspect ratio recesses, but at the expense of bulk surface uniformity across the workpiece.

Additionally the Applicants have also determined that where, particularly, an internal or immersed R.F. coil is used lack of uniformity arises through non-symmetrical coupling at the feedthroughs to the R.F. coil. These effects increase significantly with chamber pressure. This invention achieves improved base coverage previously achieved by high pressure ionisation processes whilst simultaneously achieving good surface uniformity previously achieved by lower pressure processes without the non uniformities inherent in internal R.F. coil arrangements of the prior art.

SUMMARY OF THE INVENTION

From one aspect the invention consists in a method of sputtering from a target or targets to a negatively biassed workpiece on a support, the target and support being disposed in a vacuum chamber containing a plasma and having a R.F. coil for enhancing the ionisation of the sputter material, the method including: supplying power to the R.F. coil at a frequency in the range of 100 kHz to 2 MHz and at the same time inducing a D.C. magnetic field in the vicinity of the R.F. coil.

The D.C. magnetic field, which preferable extends normally through the R.F. coil, may be induced by a D.C. coil disposed between the target and the vicinity of the support. Preferably the D.C. coil is external to the vacuum chamber, but the R.F. coil may be internal. In certain circumstances the R.F. coil may constitute the D.C. coil.

The D.C. magnetic field may be induced by a pair of coils disposed between the target and the vicinity of the support, in which case the ratios of currents in the coil further from the support and the coil nearer to the support is about 1:3.

The chamber pressure may be between 10 and 40 mT and preferably is about 30 mT.

Conveniently the R.F. and D.C. coils are symmetrically disposed.

From another aspect the invention consists in sputtering apparatus including a vacuum chamber, means for forming a plasma in the chamber, a target or targets disposed in the chamber, a R.F. coil for enhancing the ionisation of the sputter material, a negatively biased support for a workpiece disposed in the chamber opposite the target, at least one external D.C. coil disposed between the target and the vicinity of the support for inducing a magnetic field in the vicinity of the R.F. coil, R.F. power supply means for supplying power to the R.F. coil in a frequency range of 100 kHz to 2 MHz and a D.C. power supply for supplying power to the D.C. coil.

A single coil may constitute the R.F. coil and the D.C. coil and the R.F. coil may lie within the chamber, in which case it may constitute a secondary target.

Ideally a single D.C. coil would enclose the volume between the target and the workpiece and in particular enclose the volume contained by the R.F. coil. However practical constraints may require the use of a number of D.C. coils to achieve an approximation to this ideal. To better achieve this approximation the D.C. coils may be driven at different current levels and in a particular arrangement the ratio of currents was 1:3. It may be necessary to limit current flow through the D.C. coils nearest the target to avoid magnetic interaction as the target is commonly attached to a magnetron device.

Although the invention has been defined above, it is to be understood it includes any inventive combination of the features set out above or in the following description.

BRIEF DESCRIPTION OF THE DRAWINGS

The invention may be performed in various ways and specific embodiments will now be described with reference to the accompanying drawings, in which.

DETAILED DESCRIPTION OF THE PREFERRED EMBODIMENTS

Figure 15:
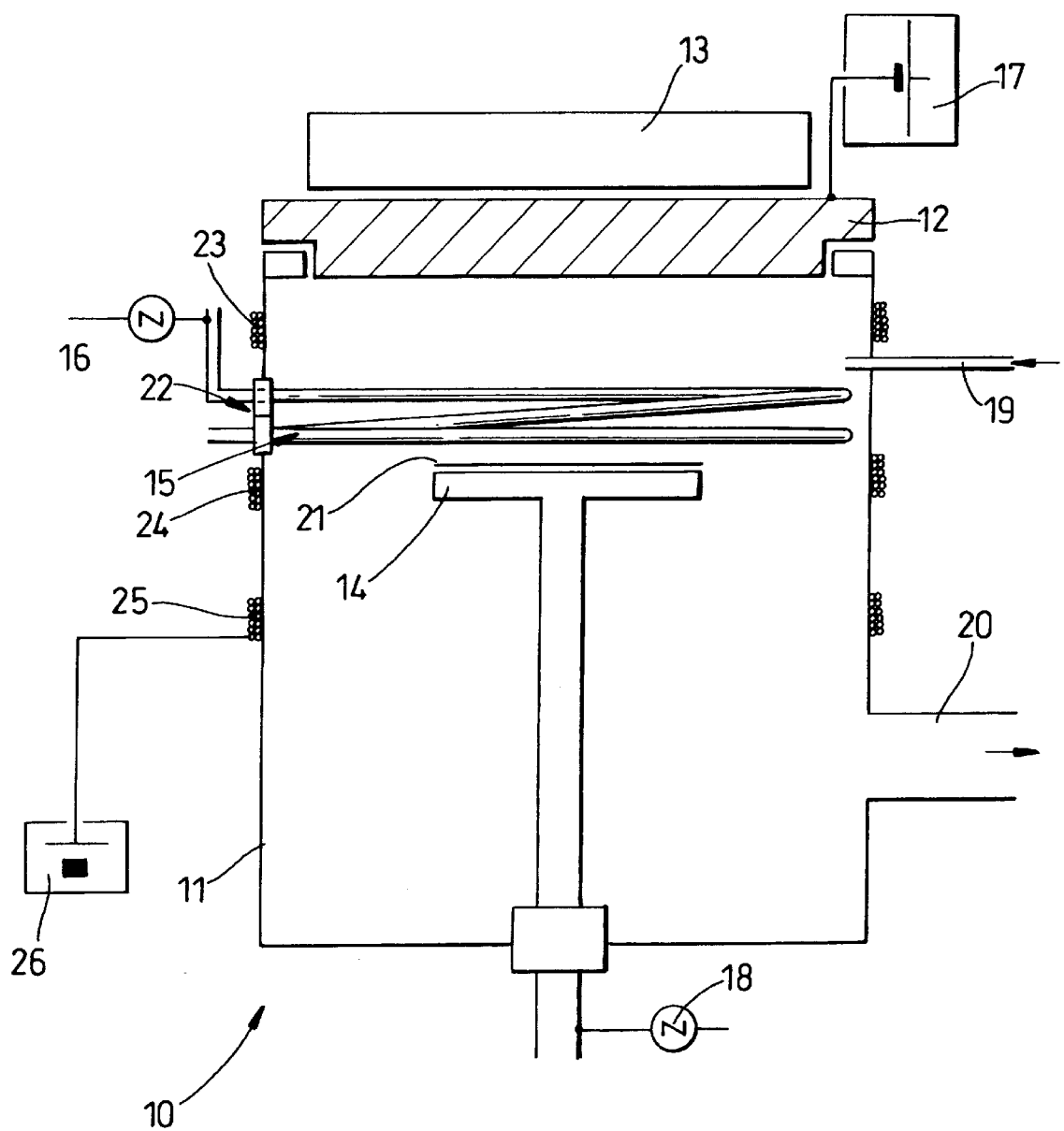
FIG. 15 is a schematic view of the apparatus used to deposit the layers illustrated in FIGS. 1 to 14.

Referring initially to FIG. 15 apparatus for sputter coating a workpiece, such as a semi-conductor wafer, is generally indicated at 10. The apparatus comprises a vacuum chamber 11, a sputter target 12 having an associated magnetron assembly 13, a heated wafer support 14, an internal R.F. coil 15, an R.F. power supply 16, a target D.C. power supply 17 and an optional R.F. power supply 18 for the support 14. The vacuum chamber 11 is provided with a gas inlet 19 and an outlet 20, which connects to a vacuum pump not shown.

To that point, the apparatus is entirely conventional and operates as is well known in the art. Briefly a plasma is maintained and created in the vacuum chamber 11 by the target D.C. power supply 17. Ions from the plasma strike the target 12, which is negatively biased by the D.C. power supply 17, to eject material. The magnetron assembly is provided to trap electrons near the target so as to increase their ionising effect. Material sputtered from the target impinges on the R.F. coil 15 and may be re-sputtered by the plasma. Additionally or alternatively the R.F. coil may be made of the target material. A further target may be provided in which case the R.F. coil may be external.

FIGS. 1 to 8 illustrate the use of such apparatus under various process conditions. The results indicated by these figures and indeed by FIGS. 9 to 14 are tabulated in Table 1 below. It will be understood that although the contours are showing local electrical resistance this measurement is directly indicative of thickness and can be thought of as such. Specifically thickness non-uniformity is indicated by a percentage standard deviating a lower figure indicating a more uniform field.

| Figure | RF | Pressure | Non-Unif | Comments |
|---|---|---|---|---|
| 1 | none | 2 | 5 | Effects of pressure, no RF coil, no DC coils |
| 2 | none | 10 | 11 | Contour patterns are radially symmetric |
| 3 | none | 30 | 22 | |
| 4 | 13.56 MHz | 10 | 8 | With RF added, the effects of the coil feedthroughs are increasingly evident as the pressure increases. |
| 5 | 13.56 MHz | 25 | 15 | |
| 6 | 13.56 MHz | 40 | 31 | |
| 7 | 13.56 MHz | 40 | 25 | RF connections to feedthrough reversed contour pattern also reverses |
| 8 | 13.56 MHz | 40 | 32 | Symmetrical RF drive Contours follow zero volts point |
| 9 | 13.56 MHz | 10 | 16 | DC coil current added - less uniform |
| 10 | 375 kHz | 20 | 20 | Lower frequency, with RF but no DC coils Radially symmetric |
| 11 | 375 kHz | 30 | 4 | DC coil current added - 50A/150A |
| 12 | 375 kHz | 30 | 10 | 3rd coil added - 50A/150A/100A |
| 13 | 375 kHz | 30 | 5 | Less current - 50A/100A |
| 14 | 375 kHz | 30 | 50 | Less again - 25A/75A |

Figure 1:
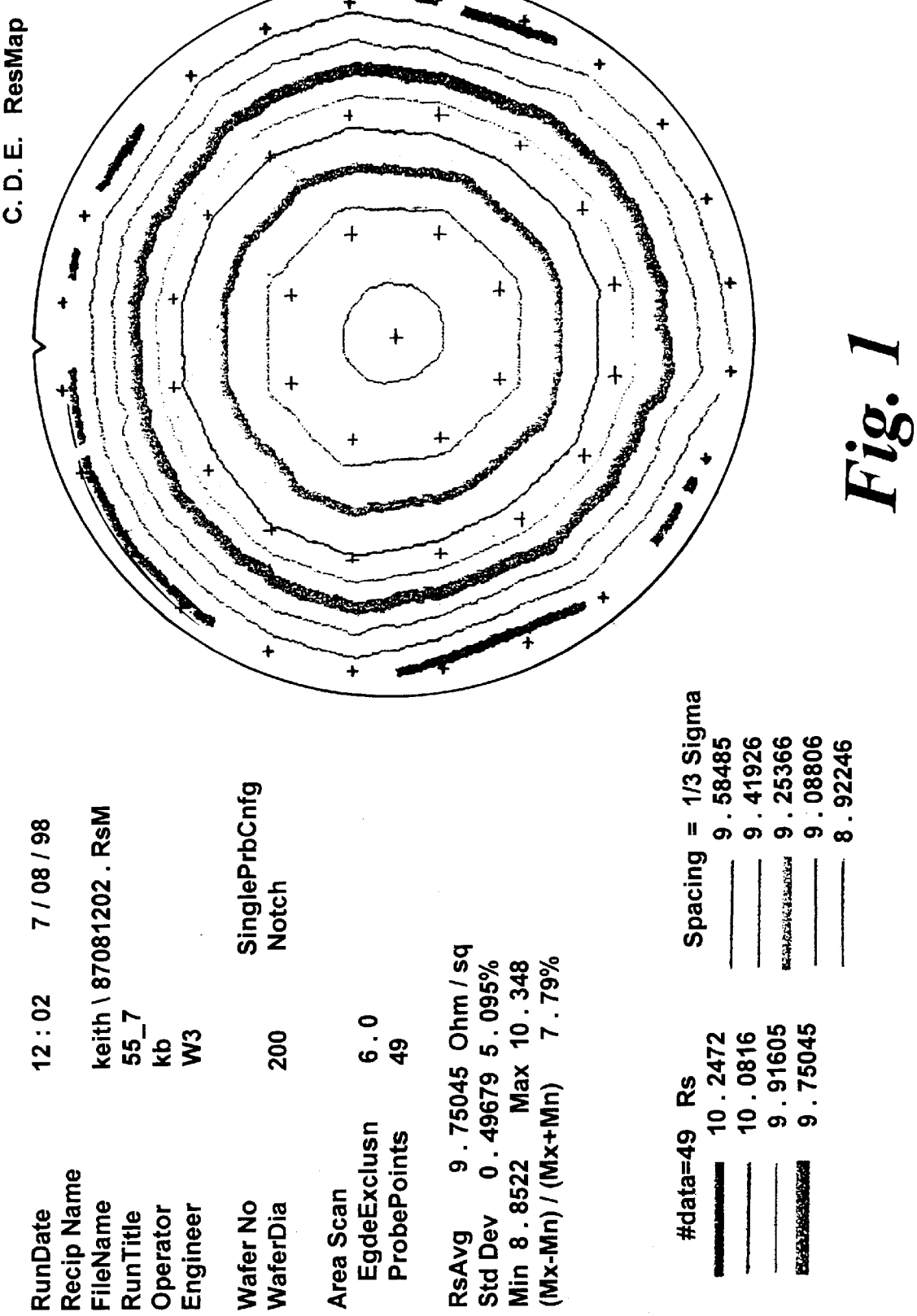
FIGS. 1 to 14 are sheet resistance contour maps of layers deposited on a workpiece under the respective conditions set out in Table 1.
Figure 2:
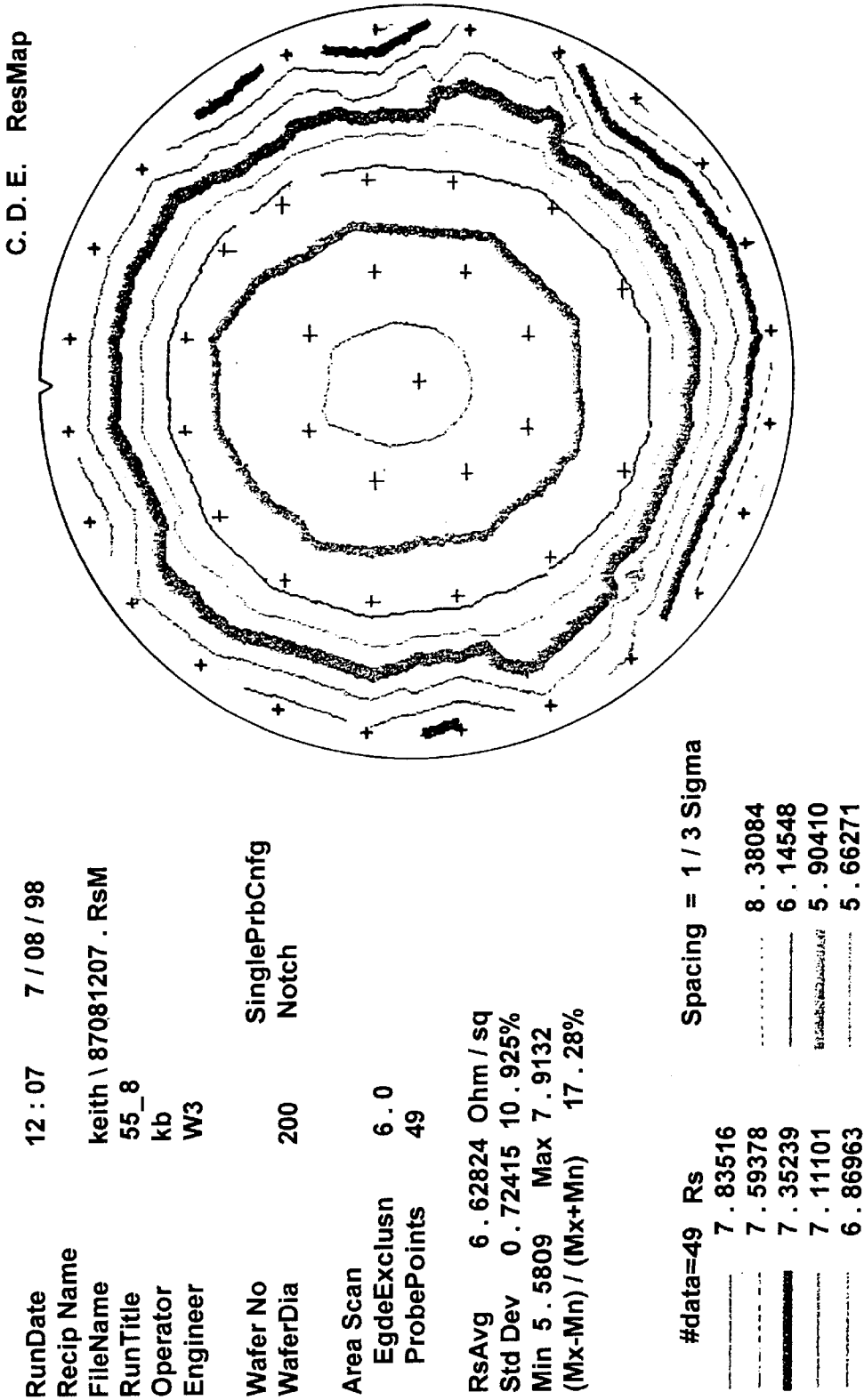
Figure 3:
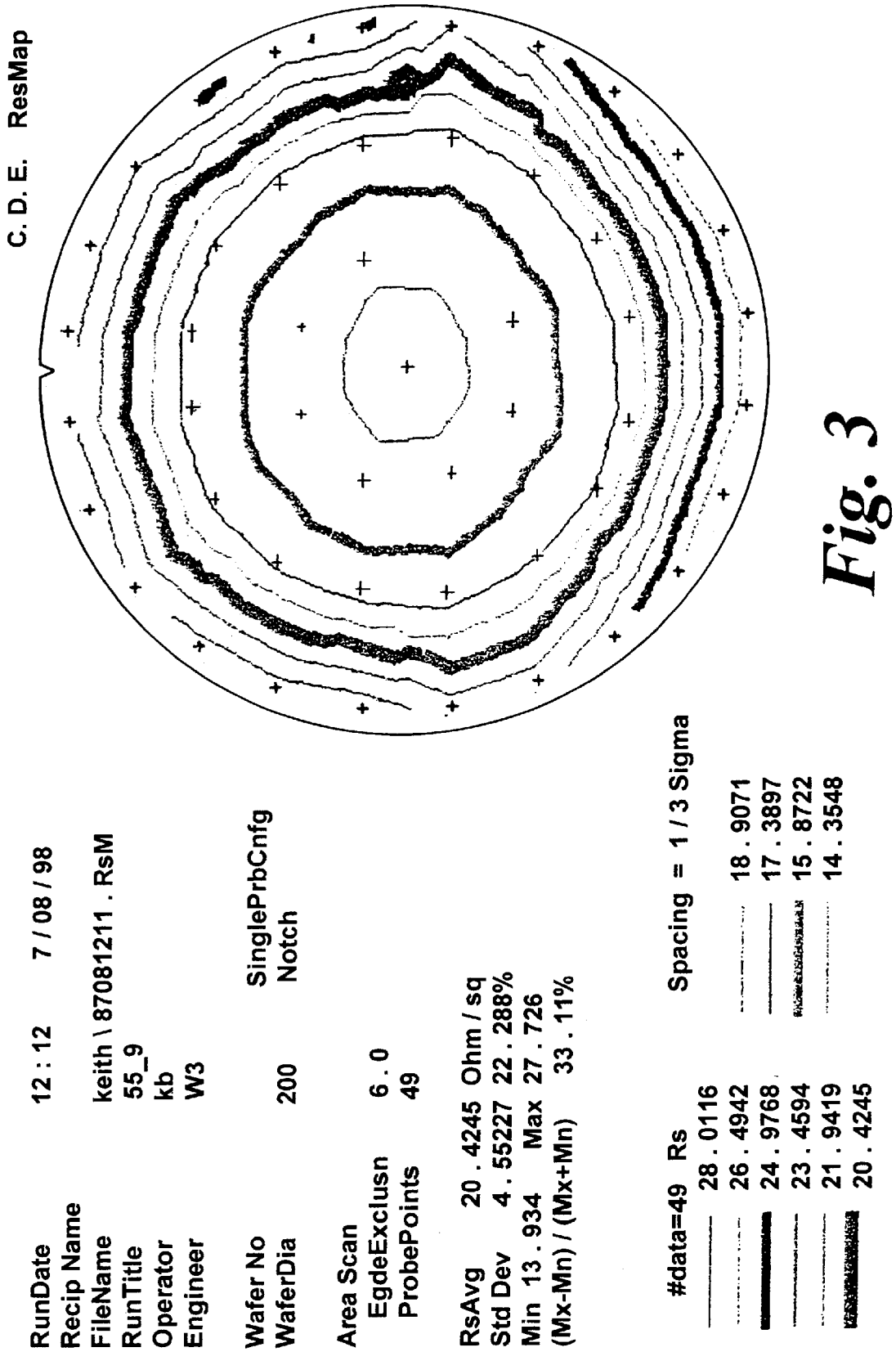

Thus in FIG. 1 it can be seen that at low pressure good uniformity of the thickness of deposition can be achieved without any R.F. coil. FIGS. 1 to 3 show that the uniformity gets worse as the pressure increases but the contour patterns are reasonably radially symmetrical. However, in the absence of R.F. power to the coil 16, the ionisation rate of the ejected material is extremely low and so on a wafer 21, mounted on the support 14, the relative amount of material deposited at the bottom of high aspect ratio formations in that wafer is low.

Figure 4:
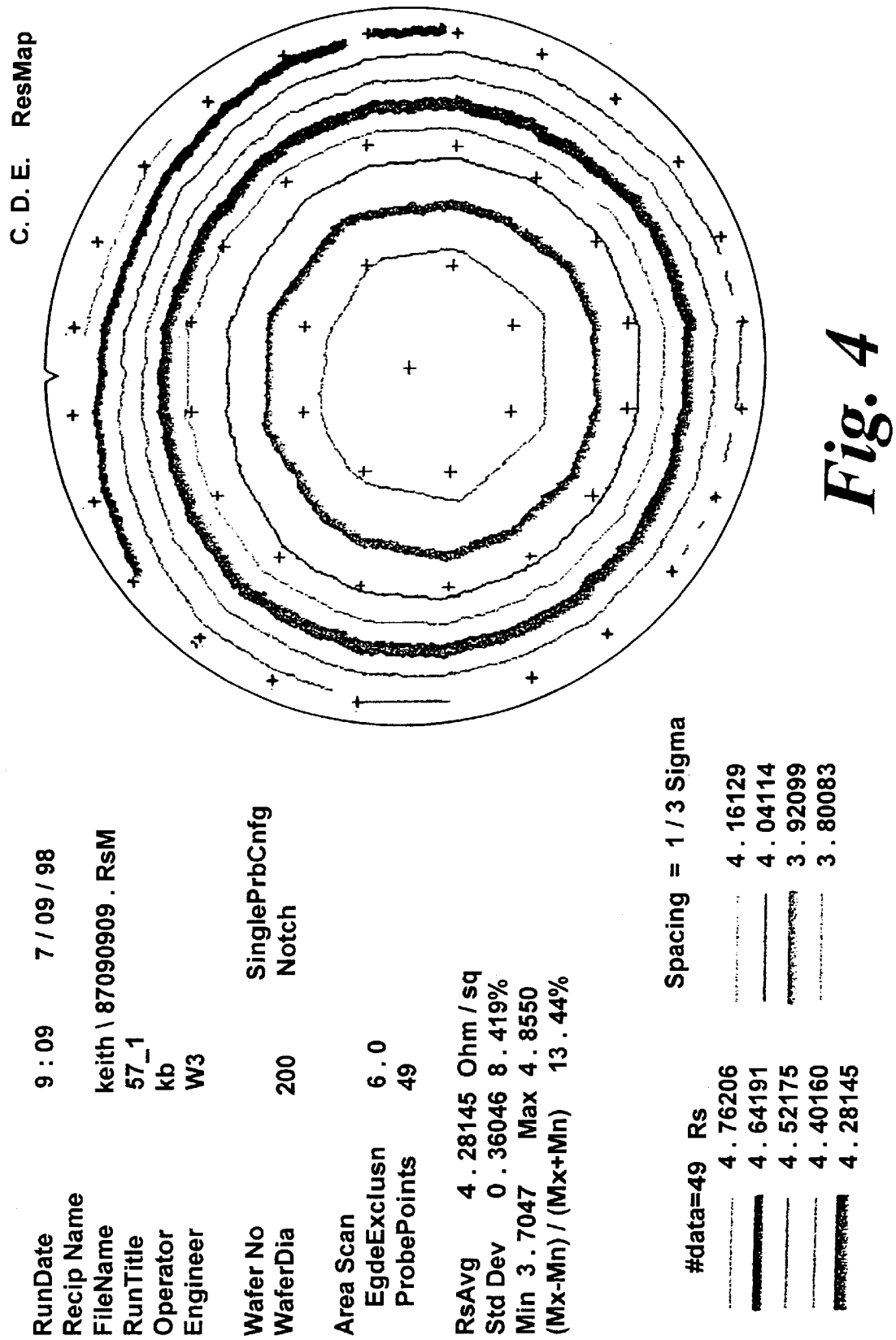
Figure 5:
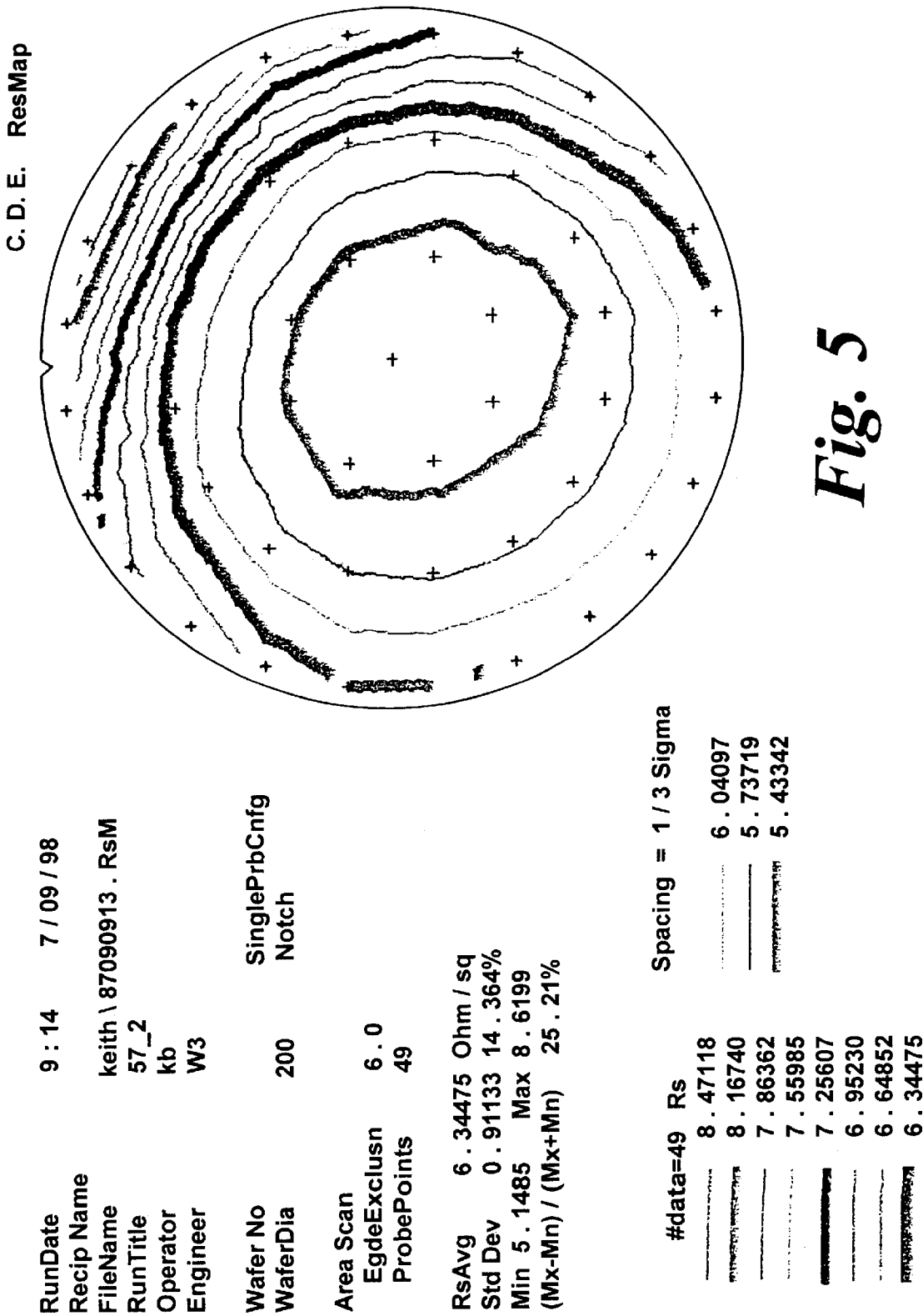
Figure 6:
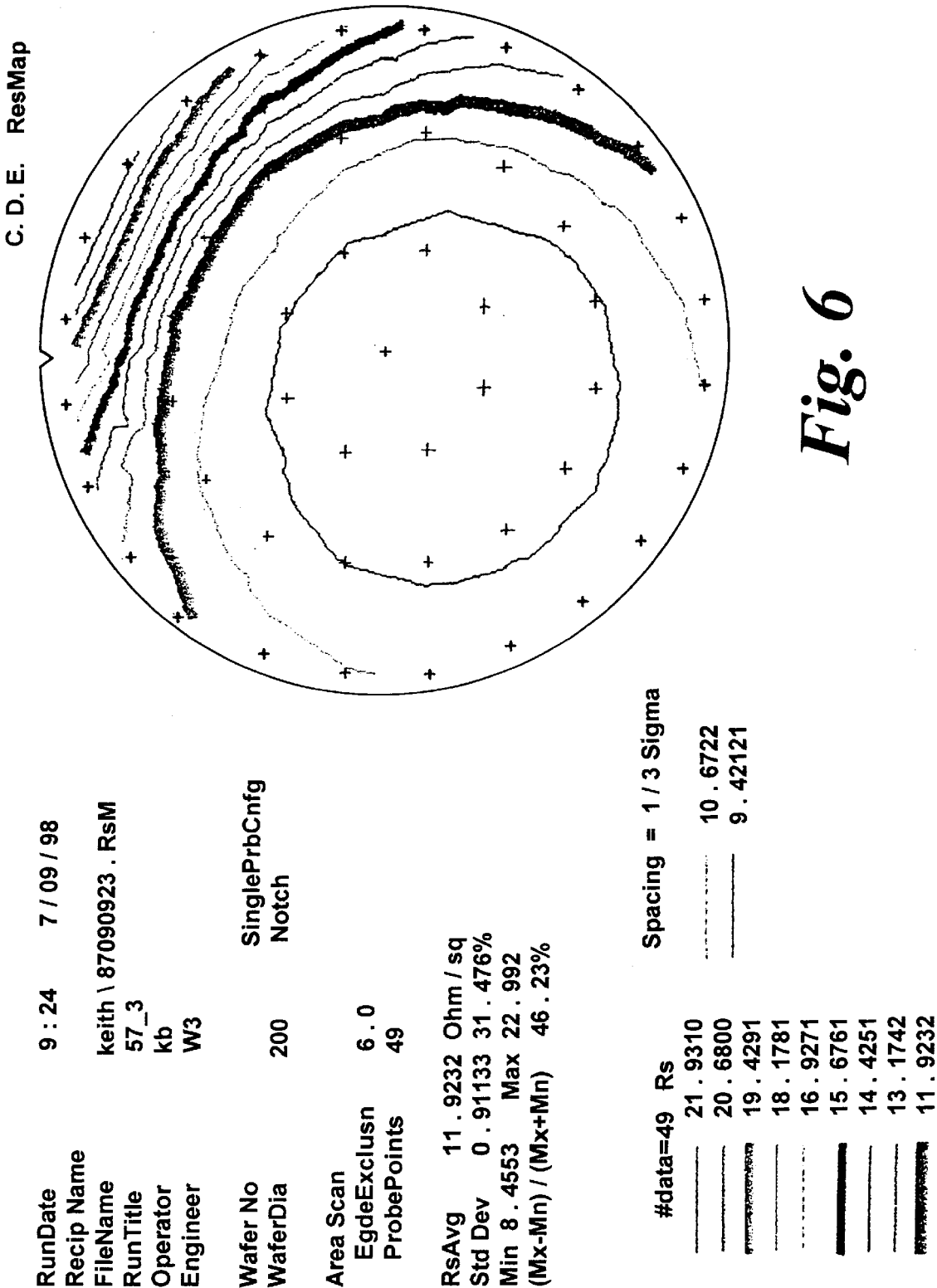
Figure 7:
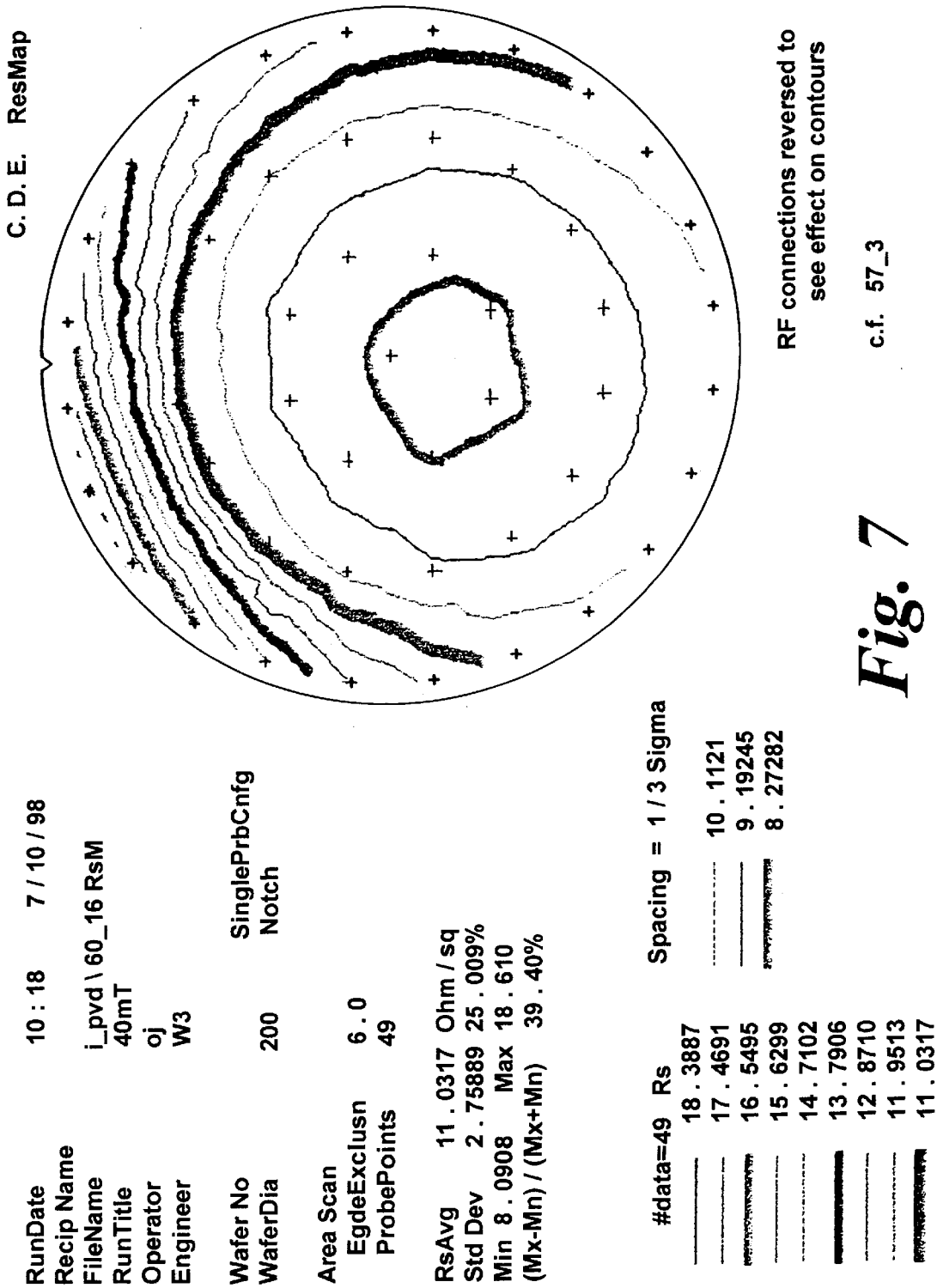
Figure 8:
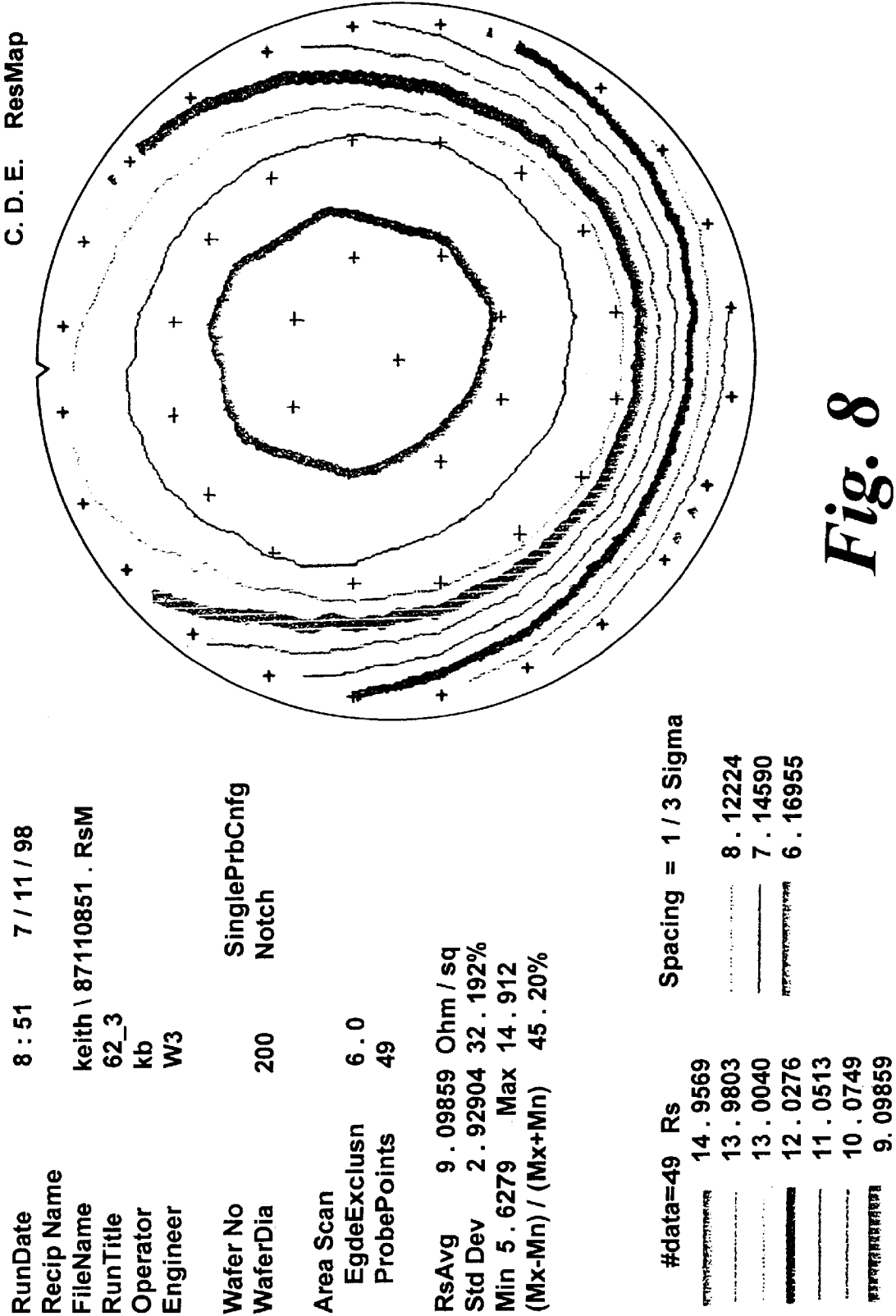
Figure 9:
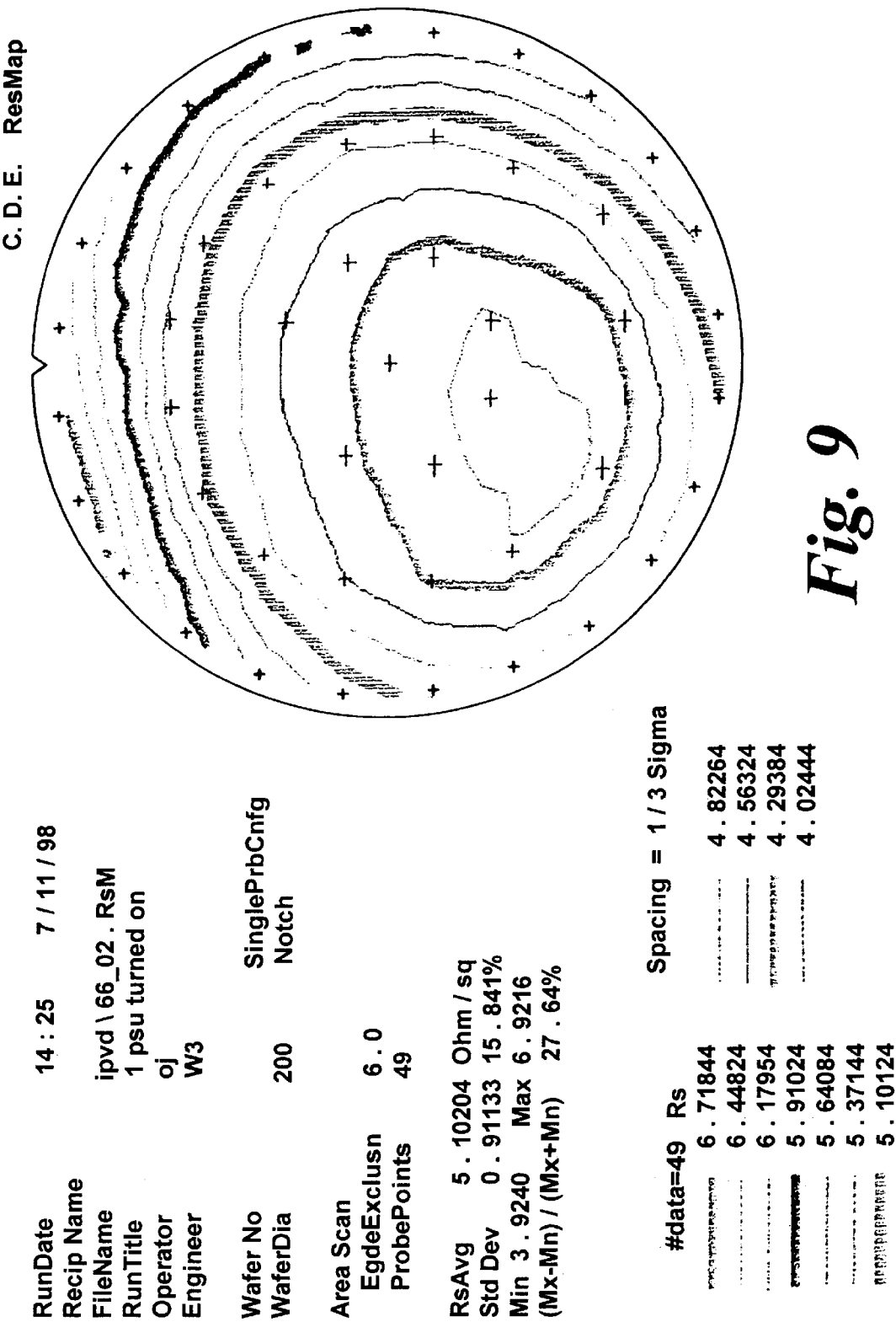

In FIGS. 4 to 6, the R.F. coil is being driven at 13.56 MHz and, in addition to decreasing uniformity with increasing pressure, it will be noted that severe distortion of the contour pattern occurs. Each wafer was orientated such that the wafer notch was adjacent the R.F. coil feedthrough at 22 and the distortion occurs in the vicinity of the R.F. coil input. In FIG. 7, the R.F. connection to the feedthroughs are reversed and it will be noted that the contour pattern reverses about the axis of the feedthrough, whilst in FIG. 8 a symmetrical R.F. drive is used with a result the contours follow the zero volts point.

The Applicants then introduced upper, middle and lower D.C. coils, 23 to 25 respectively powered by a power supply unit 26. As can be seen from FIGS. 15 and 16 the upper coil 23 lies between the target 12 and the R.F. coil 15, the middle coil 24 lies in the vicinity of the support 14 and the lower coil 25 lies well below the support 14. When currents were applied to the respective D.C. coils the uniformity was surprisingly made worse. This can be seen by comparing FIGS. 4 and 9.

Figure 10:
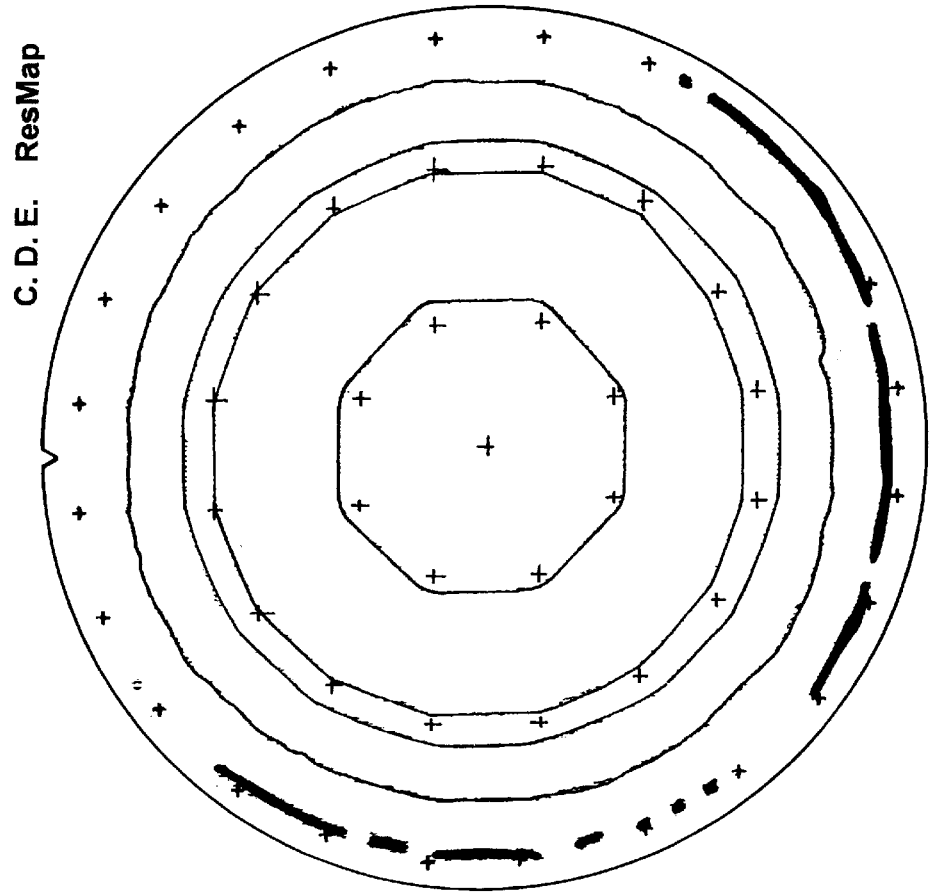

In an attempt to reduce the distortion of the contours by the R.F. coupling, the Applicants reduced the R.F. frequency to 375 kHz, but without the D.C. coils being on, and the result is shown in FIG. 10. Radial symmetry has returned, but the uniformity is poor.

Figure 11:
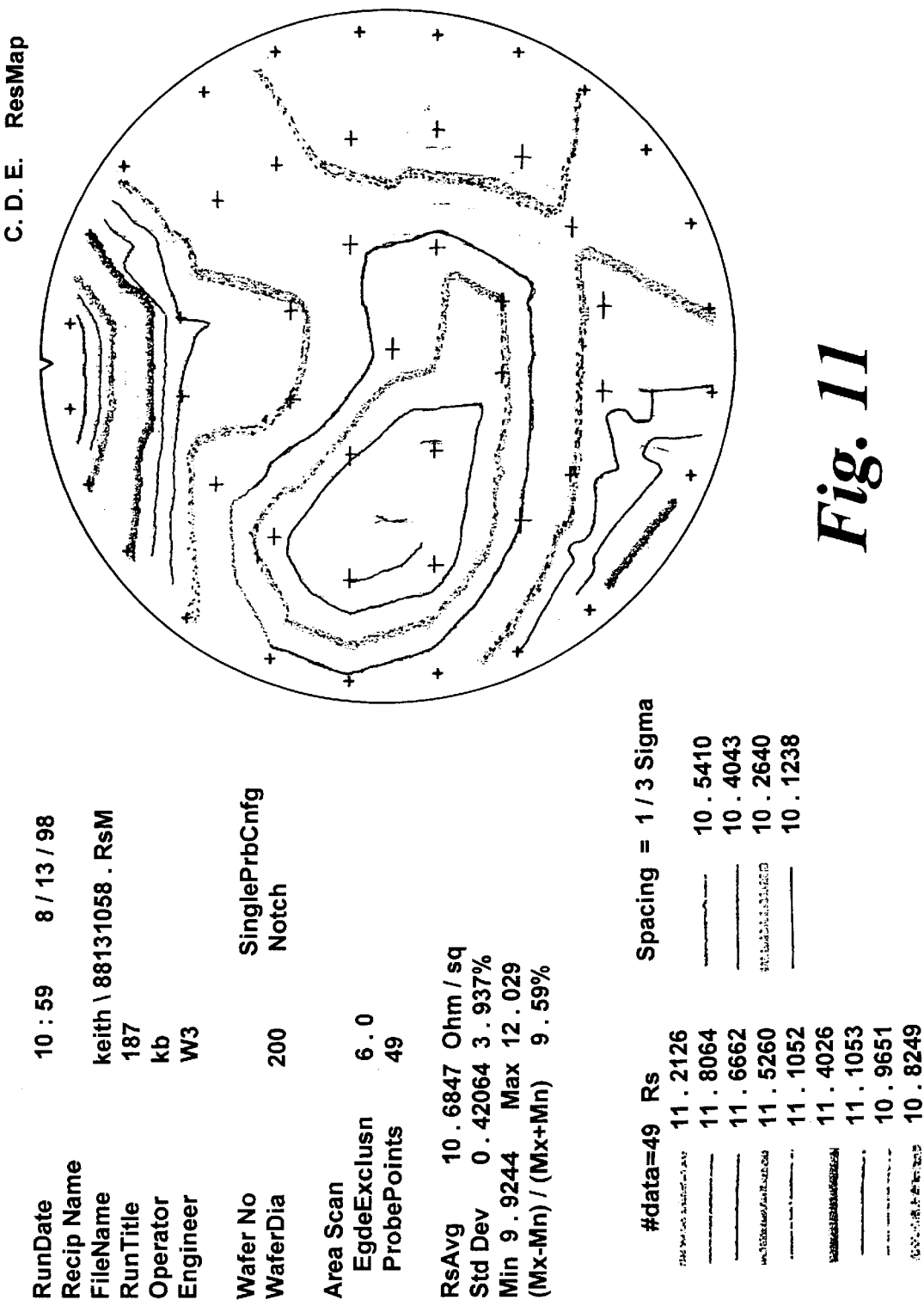
Figure 12:
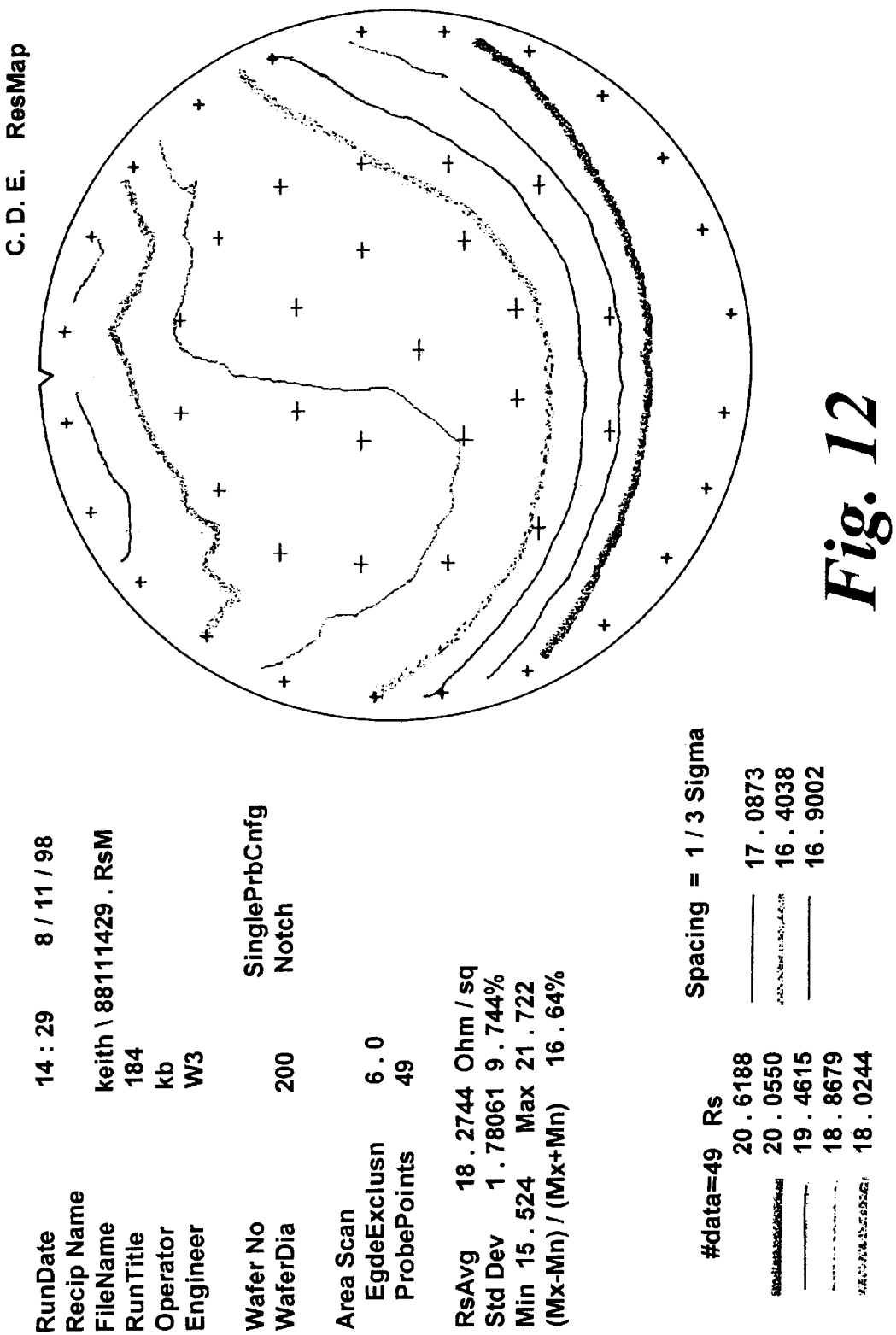
Figure 13:
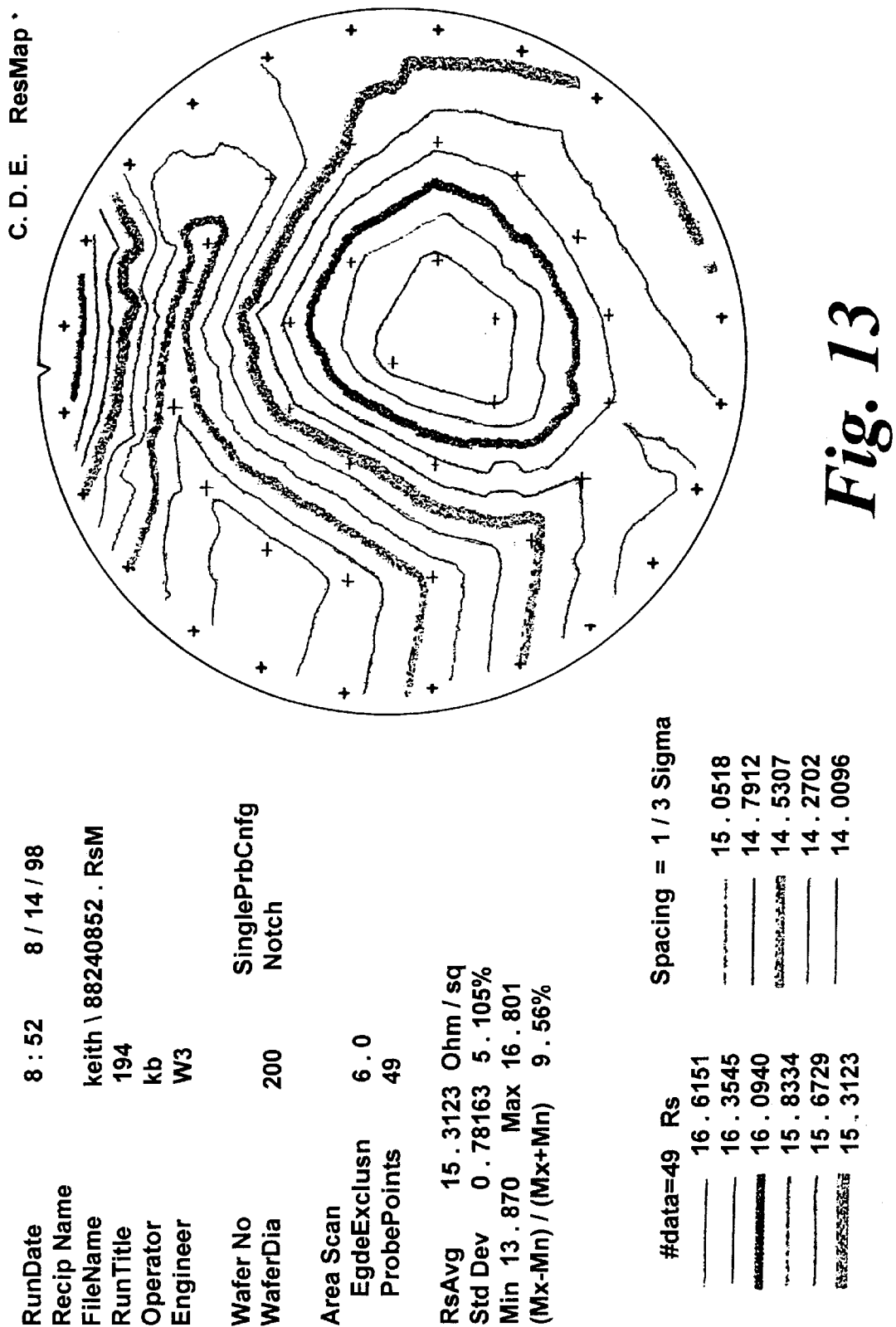
Figure 14:
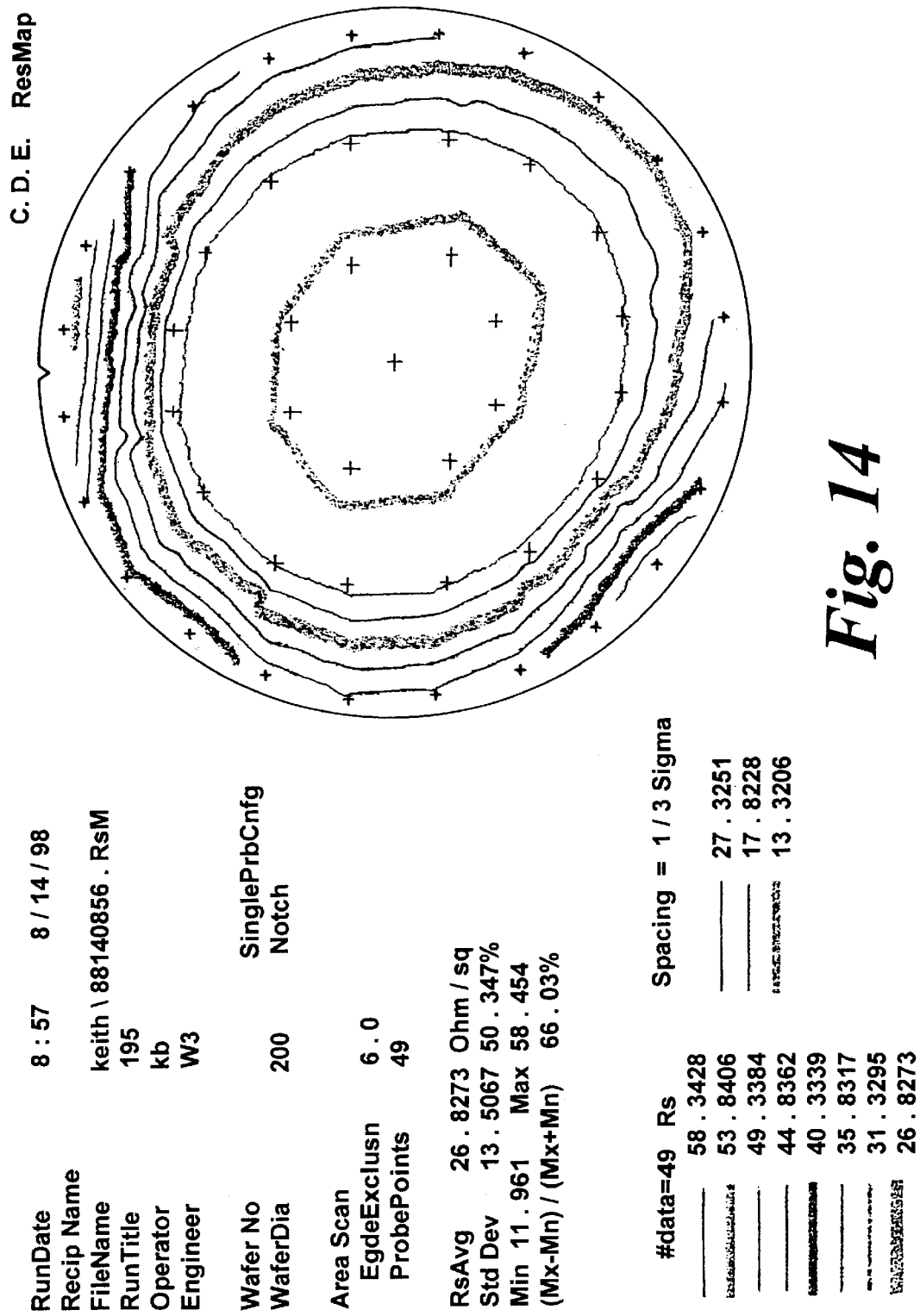

The Applicants then switched on the upper and middle coils 23, 24 supplying 50 Amps to the upper coil and 150 Amps to the middle coil and the result is shown in FIG. 11. In complete contrast to the high frequency situation, the uniformity is dramatically increased as compared with FIG. 10 even though the chamber pressure in this experiment is higher, which as can be seen, for example, from FIG. 3 normally reduces uniformity. FIGS. 12 to 14 illustrate further experiments and these seem to indicate that the lower coil 25 has little or no effect and that uniformity is best when the middle coil 24 is run at a higher current that the upper coil 23 and that if the currents are too greatly reduced the benefits may disappear. Clearly the specific currents illustrated relate to the particular set up used by the Applicants and a person skilled in the art could readily derive the necessary appropriate conditions by experimenting with particular levels of currents and particular numbers of D.C. coils, locations and lengths and the number of coil turns.

Figure 16:
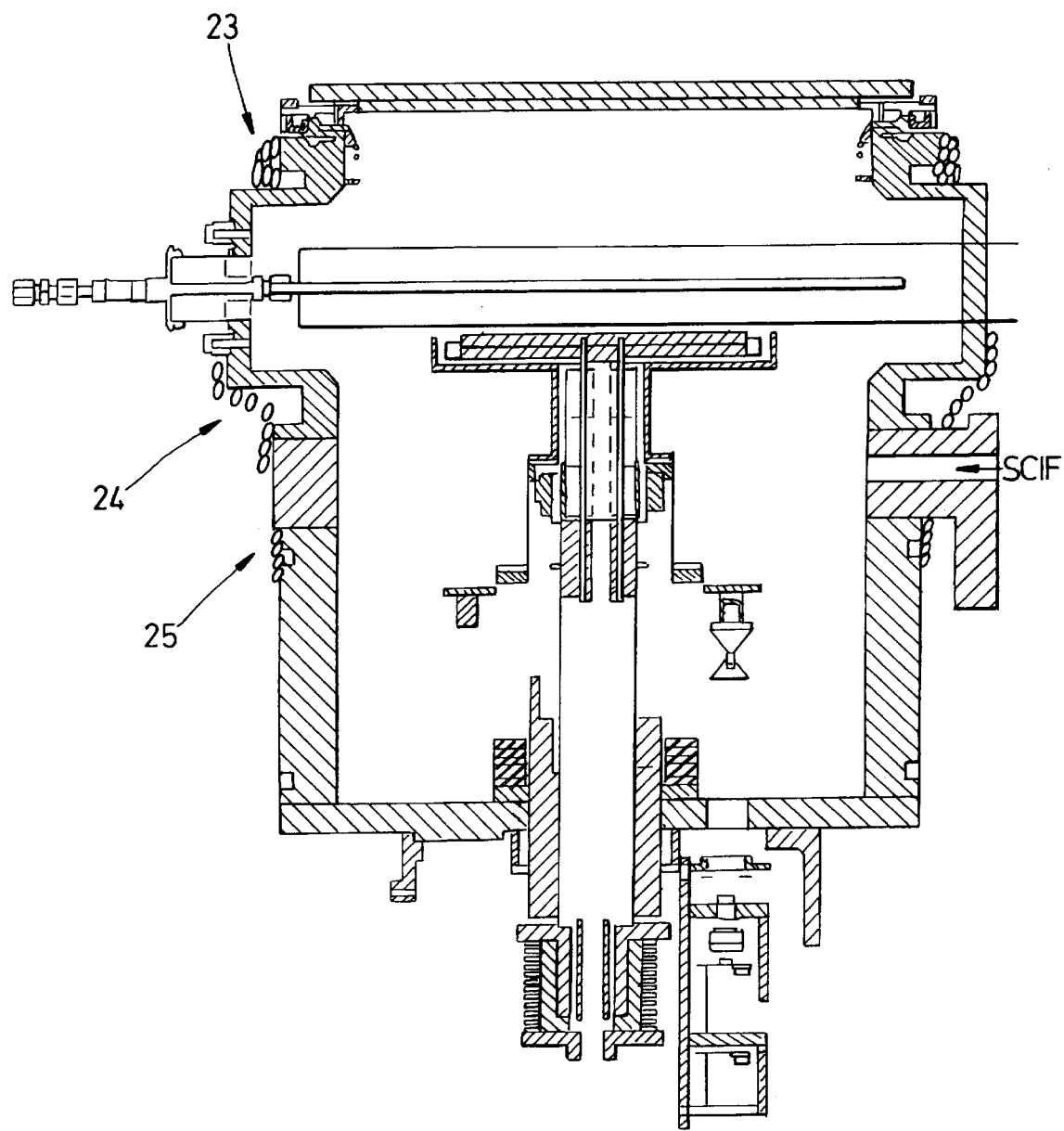
FIG. 16 is a more accurate cross-sectional view through the chamber of FIG. 15 with the location of the D.C. coil more clearly indicated.

As will be seen from FIG. 16, in the experimental arrangement, the upper and middle coils 23, 24 had the same number of turns e.g. 8.

Thus the Applicants have established that, surprisingly, if frequency of the R.F. power supplied to the immersed R.F. coil is reduced to a sufficient level to reduce capacitive coupling to the plasma to a level at which the feedthroughs do not distort the uniformity of deposition and a D.C. magnetic field is set up between the target and the workpiece, then it is possible to achieve good uniformity whilst running the sputter apparatus at a pressure which is high enough to ionise a good percentage of the ejected material and thereby ensure good coverage of the bottoms of the high aspect ratio formations. It is believed that what is happening is that the reduction in R.F. frequency reduces the capacitive coupling at the feedthroughs, whilst the magnetic field set up in the vicinity of the R.F. coil,16 traps the electrons locally, with the result that the re-sputtering (or sputtering when the R.F. coil is made of target material) from the immersed R.F. coil is greatly enhanced giving more uniform deposition.

The following experiment was performed:

In the deposition of a thin titanium film for a contact application on a 200 mm semiconductor wafer a relatively low D.C. target power of 2 kw was used on a target of 330 mm (active) diameter attached to a swept magnetron.

4 kw of 375 kHz R.F. power was applied to an immersed coil of 2 turns and 375 mm diameter. The sputter gas was Argon at 30 millitorr during sputtering.

The wafer was D.C. biased to 35–40 volts by the use of a 13.56 meg. R.F. power supply and matching unit.

When the titanium film was inspected in cross section in a scanning electron microscope (visual thickness inspection) and measured by 4 point probe (electrical resistivity measurement) the uniformity of thickness across the substrate and at the base of the recesses could be measured.

The three D.C. coils as seen in the diagram were powered according to the following schedule. Uniformity results were as follows:

| Coil location: | D.C. power applied (amps) | | | | |
| --- | --- | --- | --- | --- | --- |
| Top: | 0 | 0 | 0 | 50 | 0 |
| Mid: | 25 | 50 | 100 | 150 | 0 |
| Low: | 0 | 0 | 0 | 0 | 0 |
| Uniformity ($1\sigma_{n-1}$, %) | 26 | 19 | 10 | 4 | 25 |

The magnetic field strength at the substrate plane was measured at 50 gauss for the best result of 4% uniformity.

In this experiment there was significant improvement in the coverage at the base of wafer recesses and good uniformity when the top and middle D.C. coils were on.

In another experiment 13.56 mhz R.F. was applied to the immersed coil in the apparatus described above. In this experimented uniformity was worsened for all D.C. coil power levels set out above, but base coverage of wafer recesses was improved.

Experiments suggest that better results were obtained when the coil turns are parallel to each other and to the surface of the support 14 and the plane of the R.F. coil.

What is claimed is:

1. A method of sputtering from at least one target to a negatively biased workpiece on a support, the at least one target and support being disposed in a vacuum chamber containing a plasma and having a R.F. coil for enhancing the ionization of sputtered material, the method including: supplying power to the R.F. coil at a frequency in the range of 100 kHz to 2 MHz, and at the same time using a D.C. coil, which is wrapped around an exterior of the chamber between the at least one target and a vicinity of the support, to induce a D.C. magnetic field in the vicinity of the R.F. coil.

2. A method as claimed in claim 1 wherein the D.C. magnetic field is further induced by another D.C. coil wrapped around the exterior of the chamber in a vicinity of the support, wherein said another D.C. coil is closer to the support than the D.C. coil.

3. A method as claimed in claim 2 wherein a ratio of currents in the D.C. coil and said another D.C. coil is about 1:3.

4. A method as claimed in claim 3 wherein said vacuum chamber is at a pressure between 10 and 50 mT.

5. A method as claimed in claim 3 wherein the R.F. coil and the D.C. coil are symmetrically disposed.

6. A method as claimed in claim 2 wherein said vacuum chamber is at a pressure between 10 and 50 mT.

7. A method as claimed in claim 2 wherein the R.F. coil and the D.C. coil are symmetrically disposed.

8. A method as claimed in claim 1 wherein said vacuum chamber is at a pressure between 10 and 50 mT.

9. A method as claimed in claim 8 wherein said vacuum chamber is at a pressure about 30 mT.

10. A method as claimed in claim 9 wherein the R.F. coil and the D.C. coil are symmetrically disposed.

11. A method as claimed in claim 8 wherein the R.F. coil and the D.C. coil are symmetrically disposed.

12. A method as claimed in claim 1 wherein the R.F. coil and the D.C. coil are symmetrically disposed.

13. Sputtering apparatus comprising:

a vacuum chamber in which a plasma is formed;

at least one target disposed in the chamber;

at least one R.F. coil for enhancing an ionization of a sputtered material;

a negatively biased support for a workpiece disposed in the chamber opposite the target;

at least one D.C. coil wrapped around an exterior of the chamber between the target and a vicinity of the support for inducing a magnetic field in the vicinity of the R.F. coil;

an R.F. power supply for supplying power to the R.F. coil in a frequency range of 100 kHz to 2 MHz; and a D.C. power supply for supplying power to the D.C. coil.

14. Apparatus as claimed in claim 13 wherein the at least one D.C. coil is a single coil and the at least one R.F. coil is a single coil.

15. Apparatus as claimed in claim 13 further comprising at least one second D.C. coil wrapped around the exterior of the chamber in a vicinity of the support, wherein the at least one second D.C. coil is closer to the support than the at least one D.C. coil.

16. Sputtering apparatus comprising:

a vacuum chamber in which a plasma is formed;

at least one target disposed in the chamber;

a negatively biased support for a workpiece disposed below and opposite the target in the chamber;

at least one R.F. coil, disposed in the chamber between the at least one target and the support, for enhancing an ionization of a sputtered material;

at least one first D.C. coil wrapped around an exterior of the chamber between the target and the R.F. coil;

at least one second D.C. coil wrapped around the exterior of the chamber below the R.F. coil in a vicinity of the support;

an R.F. power supply for supplying power to the R.F. coil in a frequency range of 100 kHz to 2 MHz; and at least one D.C. power supply for supplying a D.C. power to the at least one first and second D.C. coils.

17. Apparatus as claimed in claim 16, wherein the at least one D.C. power supply supplies power to the at least one D.C. coil and the at least one second D.C. coil such that a current ratio between the at least one D.C. coil and the at least one second D.C. coil is about 1:3.

18. Apparatus as claimed in claim 16, wherein a current supplied by the at least one D.C. power supply is greater in the at least one second D.C. coil than in the at least one first D.C. coil.

19. Apparatus as claimed in claim 16, wherein a current supplied by the at least one D.C. power supply is about three times greater in the at least one second D.C. coil than in the at least one first D.C. coil.

* * * * *